US009496136B2

(12) United States Patent
Kim et al.

(10) Patent No.: US 9,496,136 B2
(45) Date of Patent: Nov. 15, 2016

(54) GROUP IV NANOPARTICLE FLUID

(75) Inventors: Hyungrak Kim, Saratoga, CA (US); Malcolm Abbott, Sunnyvale, CA (US); Andreas Meisel, Mountain View, CA (US); Elizabeth Tai, Cupertino, CA (US); Augustus Jones, Sunnyvale, CA (US); Dmitry Poplavskyy, San Jose, CA (US); Karel Vanheusden, Los Altos, CA (US)

(73) Assignee: Innovalight, Inc., Sunnyvale, CA (US)

( * ) Notice: Subject to any disclaimer, the term of this patent is extended or adjusted under 35 U.S.C. 154(b) by 531 days.

(21) Appl. No.: 12/889,925

(22) Filed: Sep. 24, 2010

(65) Prior Publication Data

US 2011/0012066 A1    Jan. 20, 2011

Related U.S. Application Data

(62) Division of application No. 12/493,946, filed on Jun. 29, 2009, now Pat. No. 7,910,393.

(60) Provisional application No. 61/187,731, filed on Jun. 17, 2009.

(51) Int. Cl.
*B01J 13/00* (2006.01)
*H01L 21/02* (2006.01)

(52) U.S. Cl.
CPC ... *H01L 21/02532* (2013.01); *H01L 21/02381* (2013.01); *H01L 21/02601* (2013.01); *H01L 21/02628* (2013.01); *H01L 21/02658* (2013.01)

(58) Field of Classification Search
CPC .............. H01L 21/02532; H01L 21/02601; H01L 21/02381; H01L 21/02658; H01L 21/02628
USPC .............. 516/34; 977/814; 106/31.33, 31.58, 106/31.37
See application file for complete search history.

(56) References Cited

U.S. PATENT DOCUMENTS

| | | | |
|---|---|---|---|
| 3,632,438 A | | 1/1972 | Carlson et al. |
| 4,122,232 A * | | 10/1978 | Kuo ............... 252/512 |
| 4,409,261 A * | | 10/1983 | Kuo ............... 252/512 |
| 5,151,386 A * | | 9/1992 | Bottari et al. ........ 438/98 |
| 5,741,836 A | | 4/1998 | Krenceski et al. |
| 5,811,030 A * | | 9/1998 | Aoki .................... 516/33 |
| 6,322,620 B1 | | 11/2001 | Xiao ................. 106/31.92 |
| 6,413,790 B1 * | | 7/2002 | Duthaler et al. ........ 438/21 |
| 6,695,903 B1 | | 2/2004 | Kübelbeck et al. |
| 7,078,276 B1 * | | 7/2006 | Zurcher et al. ........ 438/151 |
| 7,135,350 B1 | | 11/2006 | Smith et al. |
| 7,306,823 B2 * | | 12/2007 | Sager et al. ............. 427/217 |
| 7,553,512 B2 * | | 6/2009 | Kodas et al. ......... C09D 11/30 427/101 |
| 7,615,393 B1 | | 11/2009 | Shah et al. |
| 7,910,393 B2 * | | 3/2011 | Kim et al. .............. 438/71 |
| 2003/0161959 A1 * | | 8/2003 | Kodas et al. ........ C09D 11/30 427/376.2 |
| 2004/0126582 A1 * | | 7/2004 | Ng et al. ............... 428/403 |
| 2005/0008880 A1 * | | 1/2005 | Kunze et al. ............ 428/447 |
| 2005/0089748 A1 | | 4/2005 | Ohlsen et al. |
| 2005/0224764 A1 * | | 10/2005 | Ma et al. ................ 252/500 |
| 2006/0062902 A1 | | 3/2006 | Sager et al. |
| 2006/0102228 A1 * | | 5/2006 | Sridharan et al. ........ 136/256 |
| 2006/0137567 A1 * | | 6/2006 | Yadav .................. 977/700 |
| 2006/0163744 A1 | | 7/2006 | Vanheusden et al. |
| 2006/0213601 A1 * | | 9/2006 | Boyle et al. ............ 156/89.11 |
| 2007/0178308 A1 * | | 8/2007 | Furusawa et al. ........ 428/403 |
| 2007/0215202 A1 * | | 9/2007 | Salami et al. ............ 136/256 |
| 2007/0256733 A1 | | 11/2007 | Karakida et al. |
| 2008/0078747 A1 | | 4/2008 | Savu et al. |
| 2008/0171425 A1 | | 7/2008 | Poplavskyy et al. |
| 2008/0202576 A1 | | 8/2008 | Hieslmair |
| 2009/0107545 A1 | | 4/2009 | Moslehi |
| 2010/0136718 A1 | | 6/2010 | Meisel et al. |
| 2013/0119319 A1 * | | 5/2013 | Kelman et al. ........... 252/500 |

FOREIGN PATENT DOCUMENTS

| | | |
|---|---|---|
| JP | 06025633 A * | 1/1994 |
| JP | 08-239579 A | 9/1996 |
| JP | 2002-201395 A | 7/2002 |
| WO | WO 2007/060744 A1 | 5/2007 |
| WO | WO 2008/137811 A2 | 11/2008 |
| WO | WO 2009/032359 A2 | 3/2009 |

OTHER PUBLICATIONS

Xu et al., Proceedings of the National Academy of Sciences (PNAS), 2013, vol. 110, Iss. No. 10, pp. 3771-3776 (Mar. 5, 2013).*
Senapati et al, Journal of Minerals & Material Characterization & Engineering, 2009, vol. 8, Iss. No. 3, pp. 203-221 (Mar. 2009).*
Jeffrey F. Morris, A review of microstructure in concentrated suspensions and its implications for rheology and bulk flow, Rheologica Acta, 2009, vol. 48, Iss. No. 8, pp. 909-923 (Suspensions RheoPhysics Special Issue, Oct. 2009).*
Wagner et al., Shear thickening in colloidal dispersions, Physics Today, 2009, vol. 62 Issue 10, pp. 27-32 (Oct. 2009).*
Sigma-Aldrich® (791873 Aldrich) Conductive silver printing ink, resistivity 5-6 μΩcm, online @ http://www.sigmaaldrich.com/catalog/product/aldrich/791873?lang=en&region=US (downloaded Oct. 30, 2014), pp. 1-2.*
Hung-Wen Lin et al., "The rheological behaviors of screen-printing pastes", Journal of Materials Processing Technology vol. 197, pp. 284-291 (Feb. 1, 2008), (2007©).*

(Continued)

*Primary Examiner* — Daniel S Metzmaier
(74) *Attorney, Agent, or Firm* — Foley & Lardner LLP

(57) ABSTRACT

A silicon nanoparticle fluid including a) a set of silicon nanoparticles present in an amount of between about 1 wt % and about 20 wt % of the silicon nanoparticle fluid; b) a set of HMW binder molecules present in an amount of between about 0 wt % and about 10 wt % of the silicon nanoparticle fluid; and c) a set of capping agent molecules, such that at least some capping agent molecules are attached to the set of silicon nanoparticles. Preferably, the silicon nanoparticle fluid is a shear thinning fluid.

14 Claims, 6 Drawing Sheets

(56) References Cited

OTHER PUBLICATIONS

Machine Translation of Publ. No. JP 06025633 A, published Jan. 1994, Japan Patent Office, Tokyo, Japan, online at https://dossier1.j-platpat.inpit.go.jp/tri/all/odse/ODSE_GM101_Top.action (Downloaded May 17, 2016), pp. 1-12.*

Evonik Industries, Technical Bulletin Fine Particles 11, Basic characteristicsw of Aerosil® fumed silica, Evonik Degussa Corporation, Inorganic Materials, Parsippany, NJ, USA, pp. 1-70.*

International Search Report and Written Opinion mailed Oct. 8, 2010, in corresponding PCT/US10/38596, 13 pages.

Bálint Kuthi, Edvárd, "Crystalline silicon solar cells with selective emitter and the self-doping contact," *Hiradástechnika*, LIX(6):21-31 (2004).

Bueno et al., "Simultaneous Diffusion of Screen Printed Boron and Phosphorus Paste for Bifacial Silicon Solar Cells," (2005).

Hilali, Mohamed M., "Understanding and Development of Manufacturable Screen-printed Contacts on High Sheet-resistance Emitters for Low-cost Silicon Solar Cells," A Thesis Presented to the Academic Faculty, Georgia Institute of Technology, Aug. 2005.

Mouhoub et al., "Selective Emitters for Screen Printed Multicrystalline Silicon Solar Cells," *Rev. Energ. Ren. ICPWE*, pp. 83-86 (2003).

Description for Photovoltaic Materials: Phosphorus Diffusion Source, *Ferro Electronic Material Systems*, Oct. 2007.

Sahoo et al., "Determination of Rheological Behavior of Aluminum Oxide Nanofluid and Development of New Viscosity Correlations," University of Alaska—Fairbanks, May 2008.

Szlufcik et al., "Advanced concepts of industrial technologies of crystalline silicon solar cells," *Opto-Electronics Review*, 8(4):299-306, Dec. 2000.

Wang et al., A Review on Nanofluids—Part II: Experiments and Applications, *Brazilian Journal of Chemical Engineering*, 25(4):631-648, Oct. Dec. 2008.

Xie et al., Measurements of the viscocsity of suspensions (nanofluids) containing nanosized $Al_2O_3$ particles, *High Temperatures—High Pressures*, 37:127-135, (2008).

Pamies et al., "Determination of intrinsic viscosities of macromolecules and nanoparticles. Comparison of single-point and dilution procedures," Colloid and Polymer Science, Jul. 6, 2008, 286(11):1223-1231.

* cited by examiner

GROUP IV NANOPARTICLE FLUID

CROSS-REFERENCE TO RELATED APPLICATIONS

This application is a Divisional of U.S. application Ser. No. 12/493,946, filed Jun. 29, 2009, which claims the benefit of U.S. Provisional Patent Application Ser. No. 61/187,731 filed Jun. 17, 2009, the entire disclosure of which is incorporated by reference.

FIELD OF DISCLOSURE

This disclosure relates in general to semiconductors and in particular to a sub-critical shear thinning nanoparticle fluid and methods thereof.

BACKGROUND

Semiconductors form the basis of modern electronics. Possessing physical properties that can be selectively modified and controlled between conduction and insulation, semiconductors are essential in most modern electrical devices (e.g., computers, cellular phones, photovoltaic cells, etc.).

The ability to deposit semiconductor materials using non-traditional semiconductor technologies such as printing may offer a way to simplify and hence reduce the cost of many modern electrical devices (e.g., computers, cellular phones, photovoltaic cells, etc.). Like pigment in paint, these semiconductor materials are generally formed as microscopic particles, temporarily suspended in a matrix, colloidal dispersion, or paste, and later deposited on a substrate.

For example, it may be desired to form an electrically active thin film (i.e., p-n junction, etc.) on a silicon substrate through the deposition of fluid with electrically active semiconductor particles. In order to have the fluid flow during the deposition process (e.g., inkjet print, aerosol print, screen print, etc.), it generally must have a relatively low viscosity. However, once deposited in a pattern, the same fluid must generally also have a relatively high viscosity in order to retain the pattern during the densification process. Consequently, a shear-thinning or non-Newtonian fluid is desired. That is, the fluid is rigid for shear stress $\tau$, less than a critical value $\tau_0$. Once the critical shear stress (or "yield stress") is exceeded, the material flows in such a way that the shear rate, $$\frac{\partial u}{\partial y}$$

is directly proportional to the amount by which the applied shear stress exceeds the yield stress:

$$\frac{\partial u}{\partial y} = \begin{cases} 0, \tau < \tau_0 \\ (\tau - \tau_0)/\mu, \tau \geq \tau_0 \end{cases} \quad \text{[EQUATION 1]}$$

Typically, non-Newtonian behavior may be achieved by combining in a suitable solvent, a set of high molecular weight (HMW) molecules, and a certain critical volume fraction of granular material (particles). Below the critical volume fraction, the fluid is Newtonian, whereas above the critical volume fraction, the fluid is non-Newtonian or shear-thinning.

However, in order to optimize patterned deposition, it is often desired to deposit a fluid with a substantially low volume (typically less than 10 wt %) of granular materials, which may be below the critical volume fraction for shear-thinning behavior. For example, in the deposition of thin films, higher loadings of sub-micron particles tend to form thicker films (>5 micron) which, in turn, tend to develop stress fractures when the film is densified. Furthermore, in applications where an epitaxy is required, thicker films tend to impede epitaxial growth. An epitaxy is generally a type of interface between a thin film and a substrate and generally describes an ordered crystalline growth on a mono crystalline substrate.

In view of the foregoing, there is desired a shear thinning Group IV based nanoparticle fluid with a sub-critical volume fraction.

SUMMARY

The invention relates, in one embodiment, to a Group IV based nanoparticle fluid. The nanoparticle fluid includes a set of nanoparticles-comprising a set of Group IV atoms, wherein the set of nanoparticles is present in an amount of between about 1 wt % and about 20 wt % of the nanoparticle fluid. The nanoparticle fluid also includes a set of HMW molecules, wherein the set of HMW molecules is present in an amount of between about 0 wt % and about 5 wt % of the nanoparticle fluid. The nanoparticle fluid further includes a set of capping agent molecules, wherein at least some capping agent molecules of the set of capping agent molecules are attached to the set of nanoparticles.

In some embodiments, the silicone nanoparticle fluid has a viscosity of about 5 KcP (5,000 cP=50 Poise) to about 20 KcP (20,000 cP=200 Poise) at a shear rate of about 10 sec$^{-1}$.

The invention relates, in another embodiment, to a method for forming a dual-doped emitter on a silicon substrate with a sub-critical shear thinning nanoparticle fluid, the silicon substrate comprising a front surface and a rear surface. The method includes texturing the silicon substrate; cleaning the silicon substrate; and depositing a sub-critical shear thinning nanoparticle fluid on a front surface. The method further includes baking the silicon substrate at a first temperature of between about 150° C. to about 800° C. and for a first time period between about 1 minute and about 60 minutes. The method also includes exposing the silicon substrate to a dopant source in a diffusion furnace with an atmosphere of $POCl_3$, $N_2$, and $O_2$, at a second temperature of between about 800° C. and about 950° C., and for a second time period of between about 30 minutes and about 180 minutes, wherein a PSG layer is formed. The method further includes removing the PSG layer; depositing an anti-reflection coating on the front surface; and depositing a set of front metal contacts on the front surface and a set of rear metal contacts on the rear surface.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
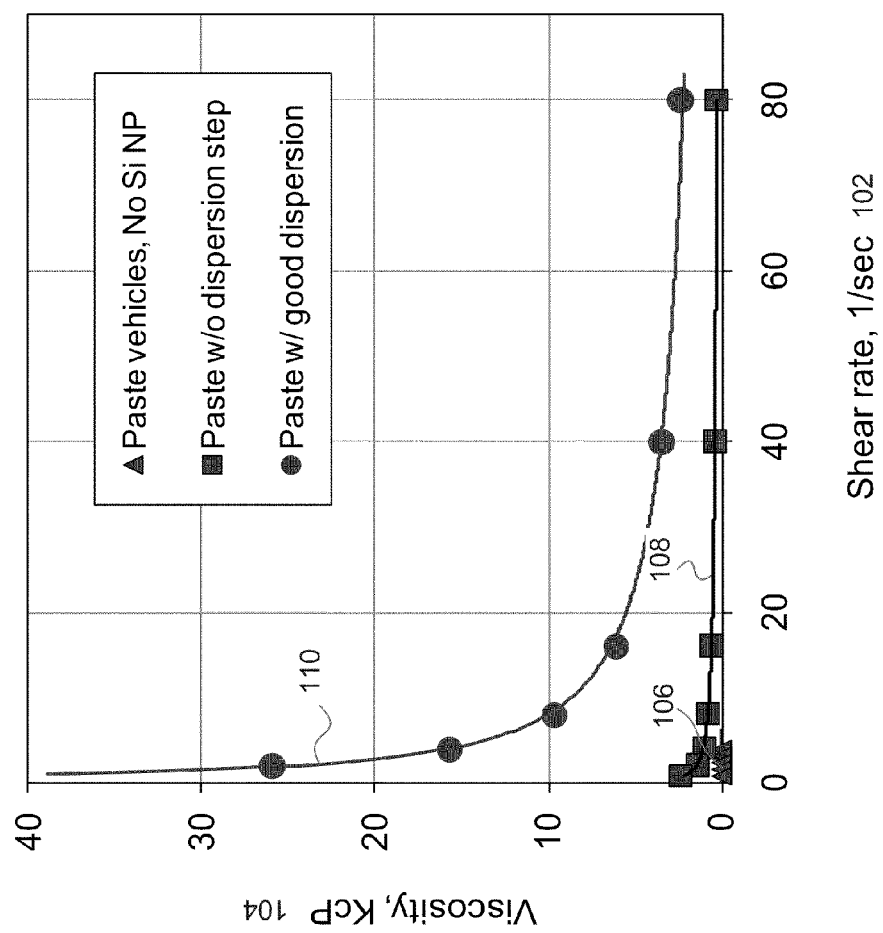
FIG. 1 shows a simplified diagram comparing viscosity to shear rate for a set of pastes, in accordance with the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, it is often difficult to deposit an electrically active thin film by a shear-thinning fluid with a low particle volume fraction. In general, a low (below a critical level) particle volume fraction is preferred for forming a thin film, while a high (above a critical level) particle volume fraction is required for a shear thinning or non-Newtonian behavior that is often required for optimal patterning on a substrate. However, shear thinning behavior is difficult to achieve with a low solid loading.

In an advantageous manner, a shear thinning Group IV based (silicon, germanium, silicon oxide, etc.) nanoparticle fluid may be formed such that an optimal thin film may be deposited and densified. The inventors believe that, in one configuration, by first substantially dispersing the set of silicon nanoparticles in a colloidal dispersion through the addition of a set of alcohol and ketone capping agents, by next optionally adding of a set of high molecular weight (HMW) molecules, such as cellulose, and then thickening the dispersion by the removal of solvents, an optimal sub-critical shear-thinning fluid may be created. In other configurations, it is further believed that other Group IV based nanoparticle fluids, comprising, for example, germanium nanoparticles and silicon nanoparticles, may yield similar results.

Nanoparticles are generally microscopic particle with at least one dimension less than 100 nm. In comparison to a bulk material (>100 nm) which tends to have constant physical properties regardless of its size (e.g., melting temperature, boiling temperature, density, conductivity, etc.), nanoparticles may have physical properties that are size dependent, such as a lower sintering temperature or a wider band gap.

Nanoparticles may be produced by a variety of techniques such as evaporation (S. Ijima, Jap. J. Appl. Phys. 26, 357 (1987)), gas phase pyrolysis (K. A Littau, P. J. Szajowski, A. J. Muller, A. R. Kortan, L. E. Brus, J. Phys. Chem. 97, 1224 (1993)), gas phase photolysis (J. M. Jasinski and F. K. LeGoues, Chem. Mater. 3, 989 (1991);), electrochemical etching (V. Petrova-Koch et al., Appl. Phys. Lett. 61, 943 (1992)), plasma decomposition of silanes and polysilanes (H. Takagi et al, Appl. Phys. Lett. 56, 2379 (1990)), high pressure liquid phase reduction-oxidation reaction (J. R. Heath, Science 258, 1131 (1992)), etc.

Cellulose is an organic compound with the formula $(C_6H_{10}O_5)n$, a polysaccharide consisting of a linear chain of several hundred to over ten thousand linked glucose units.

A capping agent or ligand is generally a set of atoms or groups of atoms bound to a central atom in a polyatomic molecular entity. In general, weak hydrostatic and electrostatic interaction between capping agents tend to increases viscosity in non-dynamic force regimes. That is, prior to the addition of a shear force. However, the addition of a relatively small shear force overcomes the hydrostatic interaction and thus tends to reduce the viscosity of the fluid.

Alcohols such as cyclohexanol, menthol, or terpineol may have an optimal chemical structure in which the terminal alcohol functional group can attach to surface Si element thru Si—O covalent bond formation. However, other alcohols may be used.

In the case of an alkyl alcohol, the bulky alkyl group generally protrudes to a dispersing medium away from the Si nanoparticles surface. In general, as the nanoparticle surface packing density of a capping agent increases, the dispersability, viscosity, and deglomeration of the nanoparticles also tends to improve. Furthermore, for configurations in which the dispersion fluid or vehicle is the same as the capping agent, dispersability may be enhanced still further since compatibility issues between the capping agent and vehicle are substantially reduced or eliminated altogether.

For a suspension of low concentration, its viscosity can be calculated by the following equation:

$$\eta/\eta_0 = 1 + 2.5\phi + K\phi^2 \qquad \text{[EQUATION 2]}$$

where $\eta/\eta_0$=relative viscosity, $\phi$=particle volumetric concentration, and K=Hugins coefficient.

In general, K varies with the degree of aggregation and the electrochemical force between particles and $5.0 \leq K \leq 15$. It is found after comparison that the measured data of viscosities. Huaqing Xie, Lifei Chen, and QingRen Wu, *Measurements of the viscosity of suspensions (nanofluids) containing nanosized $Al_2O_3$ particles*, presented at the 8th Asian Thermophysical Properties Conference, Aug. 21-24, 2007.

For example, per Equation 2, for fluids with granular materials with a particle size greater than about 100 nm, as K approaches 15 at a shear rate of 1/sec, the value of relative viscosity is estimated to be 1.13. However, in the current invention with a fluid including a sub-critical volume of high-surface area nanoparticles (less than about 100 nm), the measured relative viscosity with the same shear rate (1/sec) has been shown to be about 182, which is more than two orders of magnitude enhancement. Consequently, it has been shown that in comparison to larger particle dispersions, nanoparticle dispersions tend to have higher $n/n_0$ values, corresponding to a viscosity enhancement because of increased particle-particle interaction as previously described.

Volume fraction may be calculated using the following equation:

$$\Phi = \frac{\rho_0 \Phi_m}{\rho_0 \Phi_m + \rho_P (1 - \Phi_m)} \qquad \text{[EQUATION 3]}$$

where $\rho_P$ and $\rho_0$ are the densities of the nanoparticles and the base fluid, respectively, $\Phi$ and $\Phi_m$ are the volume and mass fraction of the powder. However, as previously stated, a critical shear thinning nanoparticle fluid tends to have a substantially smaller volume fraction than typically required for shear-thinning behavior. For example, in comparing the current invention to silver and aluminum paste, commonly used forming the front and rear contacts on a solar cell respectively, a sub-critical shear thinning nanoparticle fluid has a substantially smaller volume fraction.

|  | Silver (Ag) Paste | Aluminum (Al) Paste | Sub-Critical Shear Thinning Nanoparticle Fluid |
| --- | --- | --- | --- |
| Weight fraction | 0.8 | 0.8 | 0.09 |
| Density of vehicle | 0.95 | 0.95 | 0.95 |
| Density of powder | 10.49 | 2.70 | 2.33 |
| Volume fraction | 0.27 | 0.58 | 0.039 |

Experiment 1

Referring now to FIG. 1, viscosity is compared to shear rate for a set of pastes, in accordance with the invention. Shear rate in 1/sec 102 is shown along the horizontal axis, while viscosity in KcP 104, is shown along the vertical axis. Viscosity was measured as a function of shear rate to show the influence of silicon nanoparticles.

All fluids were prepared by dissolving an ethylcellulose binder in a terpineol ($C_{10}H_{18}O$) solvent. A first fluid 106 was prepared by dissolving a 1.5 wt % ethylcellulose binder in a terpineol solvent without silicon nanoparticles. A second fluid 108 and third fluid 110 were prepared, by mixing on a hot-pate at 100° C. for 1 hour, a 1.5 wt % ethyl cellulose binder and 8 wt % silicon nanoparticles in a terpineol solvent. The third fluid 110 was additionally sonicated in a range of about 16-20 kHz for about 3 hrs. During the sonication step, most of agglomerates from the powder production are generally broken down to much smaller with an average size of about 50 to about 150 nm.

As can be seen, fluid 106 shows a typical Newtonian behavior, where the viscosity of the fluid does not change under a different shear rate, whereas the fluids 108 & 110 show a shear thinning behavior. In addition, in comparison to fluid 108, fluid 110 shows substantial shear thinning behavior, corresponding to a better dispersion and substantial deglomeration as a result of the sonication step as previously described.

Figure 2:
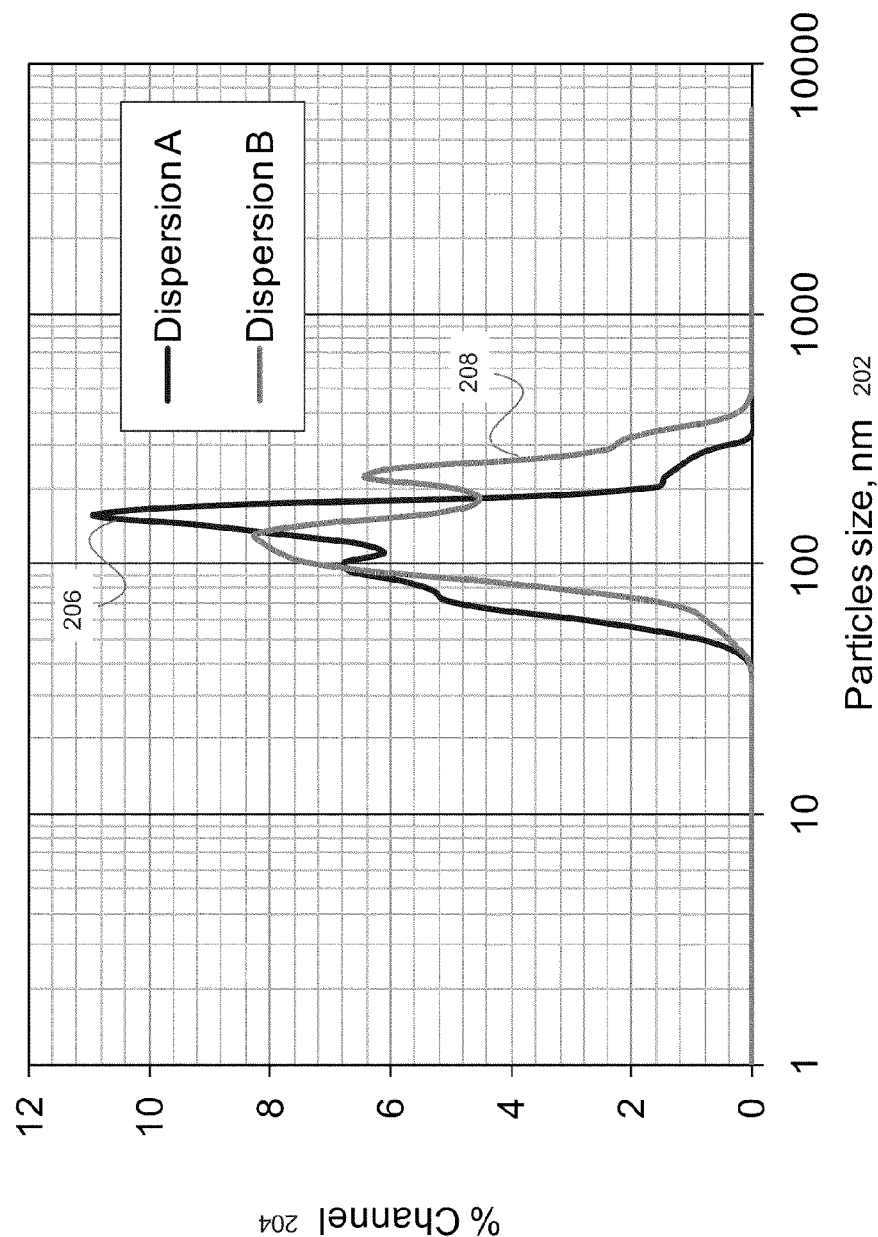
FIG. 2 shows a simplified diagram of the particle size distribution of a substantially dispersed semiconductor nanoparticle dispersion before fluid formulation, in accordance with the invention.

Referring to FIG. 2, a particle size distribution of substantially dispersed semiconductor nanoparticle dispersion before fluid formulation is shown, in accordance with the invention. In general, although the average size of dispersed particles is still much larger than the primary size of silicon nanoparticles (which range from 5 nm to 35 nm), the inventors believe organic groups present on the surface of Si nanoparticles substantially contribute to a shear-thinning fluid behavior as shown in FIG. 1.

Experiment 2

Figure 3:
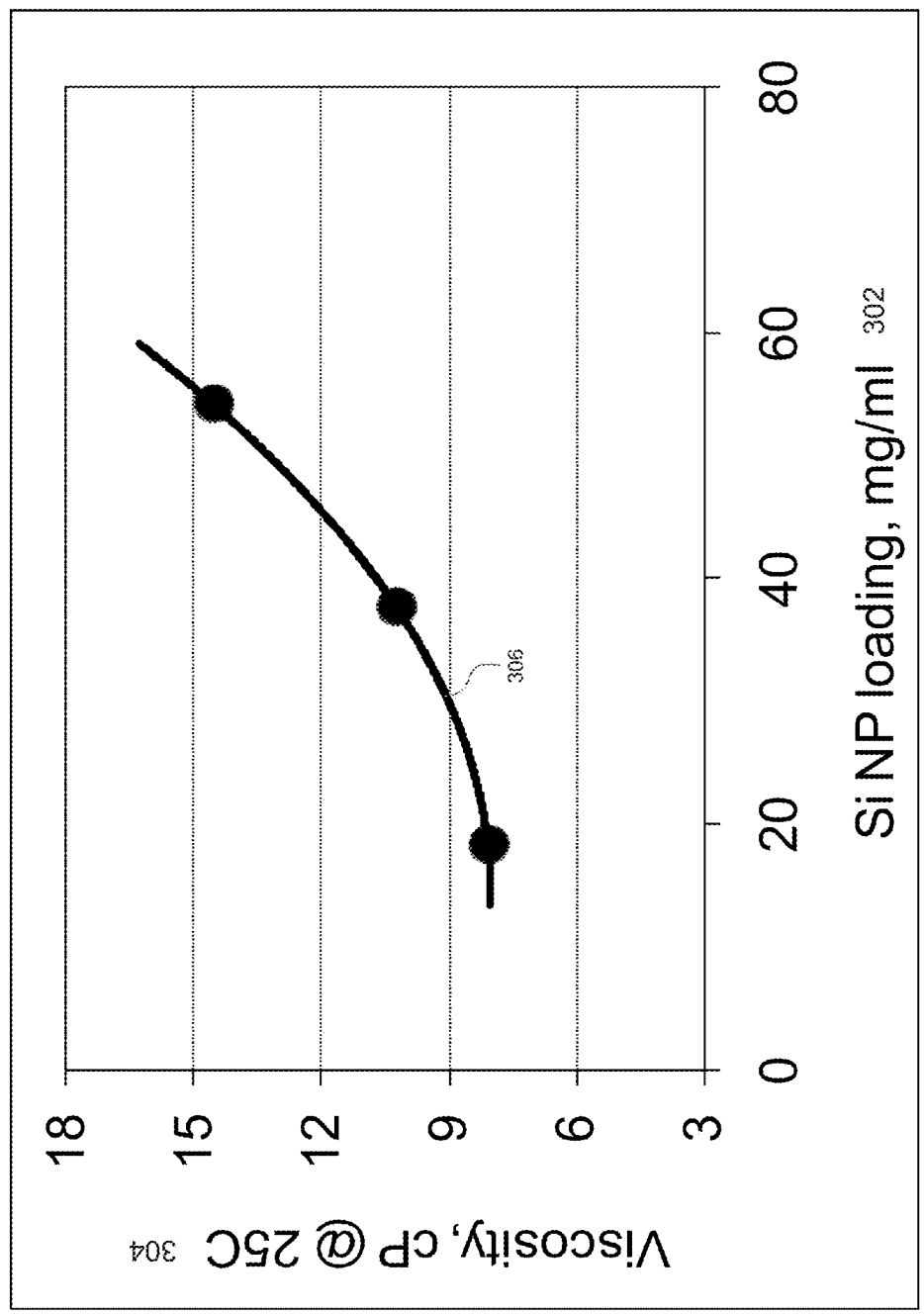
FIG. 3 shows a simplified diagram comparing viscosity to a set of silicon nanoparticle loadings, in accordance with the invention.

Referring now to FIG. 3, a simplified diagram comparing viscosity to a set of silicon nanoparticle loadings. Silicon nanoparticle loading in mg/ml 302 is shown along the horizontal axis, while viscosity in cP 304, is shown along the vertical axis.

All fluids were prepared by dissolving silicon nanoparticles in a mixture of alcohol and ketone, and then magnetically stirred at 100° C. for 1 hr. The dispersions were sonicated by sonic-horn. In one configuration, the ketone may be an alkyl ketone. In contrast to FIG. 1, viscosity values of the fluids are generally lower since binder is not present.

As can be seen, as loading increases from 20 mg/ml, viscosity substantially increases from about 7 cP to about 14 cP, corresponding to increased electrostatic and hydrophobic interactions between dispersed particles.

Figure 4:
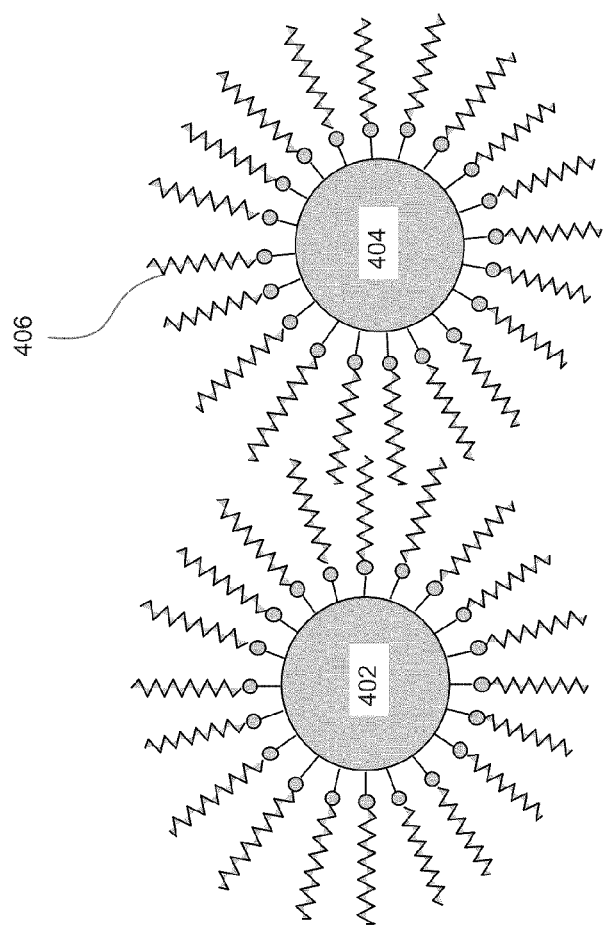
FIG. 4 shows a simplified diagram of the hydrostatic and electrostatic interaction of substantially dispersed semiconductor nanoparticles, in accordance with the invention.

Referring now to FIG. 4, a simplified diagram showing the hydrostatic and electrostatic interaction of substantially dispersed semiconductor nanoparticles. In this configuration, a set of silicon nanoparticles 402 are shown with terpineol capping agent 406. In an advantageous manner, in addition to adding a steric repulsive force that keeps the nanoparticles suspended, hydrophobic set of capping agent 406 tends to also contribute to increase the flow resistance due to the very high electrostatic interaction with other capping agents as well as with other solvents and binders in the dispersion. Furthermore, terpineol capping agent may also serve as a base solvent, and thus allow a high degree of compatibility between the capping agent and the base solvent.

Consequently, in order to create an optimal sub-critical shear thinning nanoparticle fluid, the silicon nanoparticles should preferably be present in an amount between about 1 wt % and about 20 wt %, more preferably between about 2 wt % and about 15 wt %, and most preferably between about 4 wt % and about 10 wt %. Furthermore, the proportion of HMW molecules should preferably be present in an amount between about 0 wt % and about 10 wt %, more preferably between about 0% wt and about 4 wt %, and most preferably between about 0.5 wt % and about 2 wt %. The proportion of alcohol present is preferably up to 90 wt % (with the remainder being ketone), more preferably up to 80 wt % (with the remainder being ketone), and most preferably up to 70% wt (with the remainder being ketone).

Figure 5A:
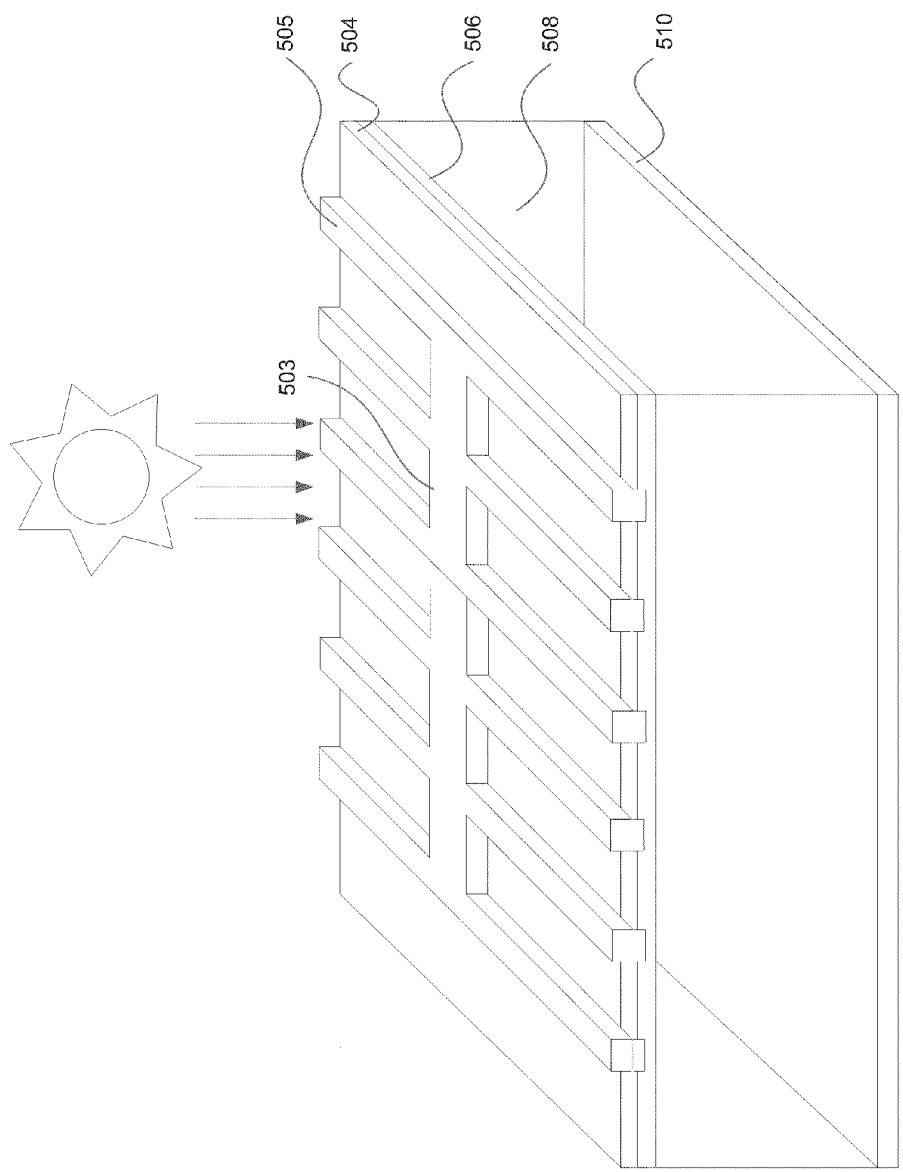
FIG. 5A-B show a simplified method for manufacturing a dual-doped emitter (selective emitter) solar cell with a sub-critical shear thinning nanoparticle fluid, in accordance with the invention.
Figure 5B:
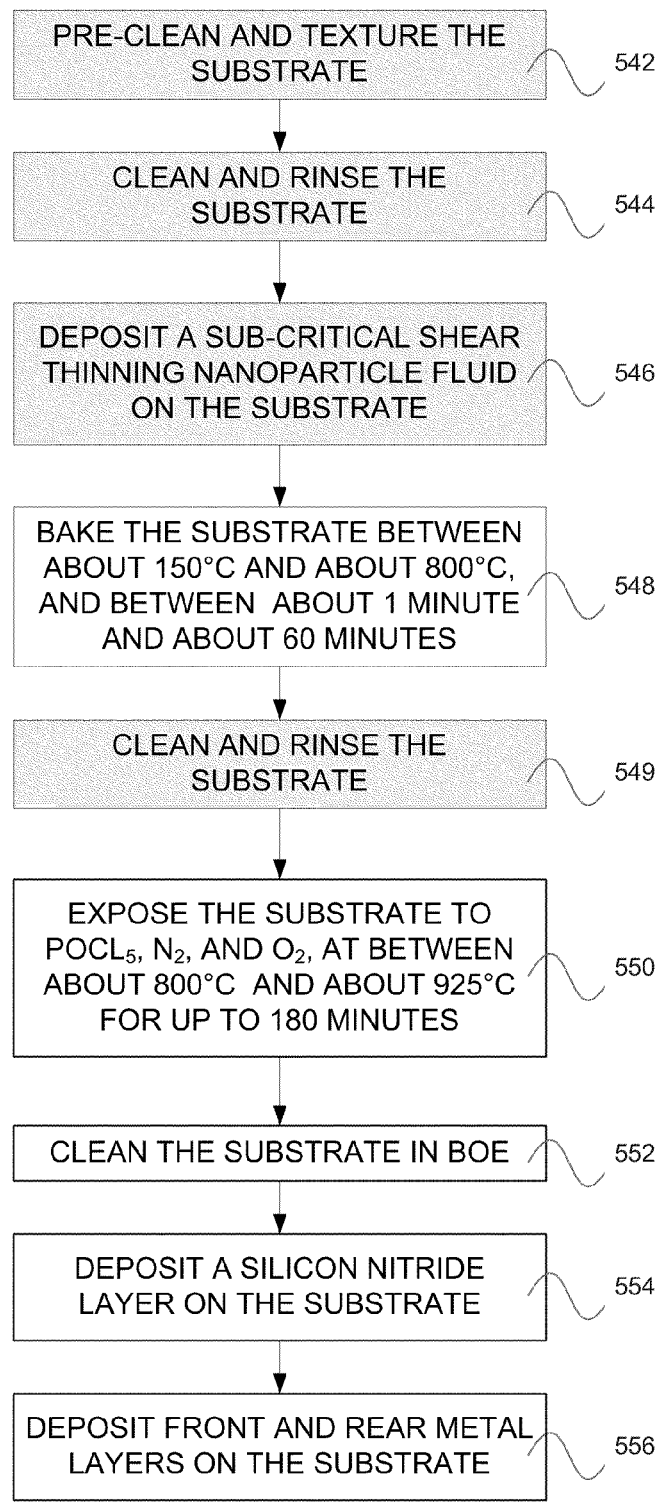

Referring to FIGS. 5A-B, a simplified method is described for manufacturing a dual-doped emitter (selective emitter) solar cell with a sub-critical shear thinning nanoparticle fluid, in accordance with the invention. A selective emitter uses a first lightly doped region optimized for low recombination, and a second heavily doped region pattern (of the same dopant type) optimized for low resistance ohmic contact formation.

FIG. 5A shows a simplified diagram of a selective emitter as manufactured in accordance with the invention.

Emitter 506 may be p-type (e.g., boron) or n-type (e.g., phosphorous) and could be formed by various methods, which include but are not limited to gas phase diffusion (such as e.g. using $POCl_3$ gas as phosphorous source or $BBr_3$ as boron source), solid source diffusion, or inline processes which typically use liquid dopant sources such as e.g. phosphoric acid.

Above and in electrical contact with the emitter 506 (which is also typically coated with an antireflection coating 504) is a front metal contact, comprising a set of fingers 505 (here with a width of about 100 um) and a set of bus bars 503. Typically made out of printed silver paste, the front metal contact is optimized to extract the charge carriers (here electrons) created in the silicon substrate when light is absorbed. The front metal contact is also typically configured with a reduced horizontal surface area (thus minimizing losses due to shading, which tend to reduce the generated current), and an increased cross-sectional aspect ratio (thus reducing the series resistance of the device, which tends to increase the efficiency of the device).

In general, untreated silicon substrates often reflect more than 30% of incident light. Consequently, in order to reduce this reflected energy and thus directly improve efficiency, the silicon substrate is generally textured and optimized with anti-reflective coatings 504 (e.g., silicon nitride (SiNx), etc.). In addition, anti-reflective coating 504 also helps passivate the surface of emitter 506, both reducing the impact of contamination of the substrate bulk from external sources, as well as substantially reducing minority carrier recombination caused by dangling Si bonds or imperfections in the doped substrate 508 surface.

In addition, on the back-side of silicon substrate 508 is often a heavily doped region (of the same type as the substrate) which creates a BSF (back surface field) 510. Minimizing the impact of rear surface recombination, a properly configured BSF tends to repel those minority carriers that are generated closer to the back-side, resulting in higher levels of minority carrier concentrations in the substrate absorber. For example, Al (aluminum) or B (boron) may be added to a p-type substrate to form a BSF layer. In contrast, for an n-type substrate, P (phosphorous) may be added to form a BSF layer. In addition, silver (Ag) pads are generally inserted in the back-side in order to facilitate soldering for interconnection into modules.

FIG. 5B shows a simplified method for manufacturing a dual-doped emitter of FIG. 5A, in accordance with the invention.

Initially at 542, the crystalline substrate is pre-cleaned in a sulfuric acid solution and then textured by treating the substrates in a solution of $H_2O$, IPA, and KOH.

At 544, the substrate is cleaned and rinsed SC-2 (generally a mixture of $H_2O$, HCl (hydrochloric acid) and $H_2O_2$ (hydrogen peroxide)), piranha (generally a mixture of sulfuric acid ($H_2SO_4$) and $H_2O_2$), BOE, and $H_2O$, respectively.

Next at 546, in an advantageous manner, a sub-critical shear thinning nanoparticle fluid (comprising 8 wt % silicon nanoparticles) is deposited on each textured crystalline silicon substrate. In a common configuration, a screen printer is used. In one configuration, a sub-critical shear thinning nanoparticle fluid may be preferably deposited (as measured prior to step 548) with a fluid mass per unit substrate surface area of between about 0.04 mg/cm$^2$ to about 3.0 mg/cm$^2$, more preferably between about 0.2 mg/cm$^2$ to about 2.0 mg/cm$^2$, and most preferably between about 0.4 mg/cm$^2$ to about 1.5 mg/cm$^2$.

At 548, the crystalline silicon may be baked at a temperature of between about 150° C. to about 800° C. for a time period between about 1 minute and about 60 minutes, in order to densify the film. The baking ambient may be one of inert (such as nitrogen), oxidizing (such as air), or a combination of both nitrogen and oxygen. Furthermore, the baking apparatus may be a belt furnace, a tube furnace, or a convection oven.

At 549, the crystalline silicon substrate is optionally cleaned to remove any possible contaminants accumulated during previous steps. The cleaning options may include HCl, HF/HCl, diluted HF, buffered oxide etch (BOE), SC-1 (generally a mixture of $NH_4OH+H_2O2+H_2O$), SC-2 and other cleaning mixtures.

At 550, the crystalline silicon substrate is exposed to a dopant source in a diffusion furnace with an atmosphere of $POCl_3$, $N_2$, and $O_2$, at a temperature between about 800° C. and about 950° C. and for a time period of up to about 3 hours.

At 552, the crystalline silicon substrate is exposed to a cleaning agent, such as e.g. BOE (generally buffered HF), diluted HF, or mixture of HF and HCl. The degree of removal of the residual PSG layer and the thickness of the densified silicon nanoparticle film may be controlled by varying the period of exposure to the cleaning agent from about 0 minutes to about 60 minutes and by controlling the concentration of the cleaning agent in the cleaning bath. Greater etchant exposure corresponds to a thinner densified silicon nanoparticle film and a more thorough removal of the PSG layer. In addition, typically an etchant exposure greater than 10 minutes substantially removes the thinner densified silicon nanoparticle film.

At 554, in order to minimize reflection and to optimize surface passivation, an anti-reflection coating and passivation layer of silicon nitride ($Si_3N_4$ and other non-stoichiometric ratios of Si and N) is deposited on the silicon substrate in an ambient of silane, ammonia, nitrogen, and optionally hydrogen. Here, the reflective index of the $Si_3N_4$ layer may be between about 1.90 and about 2.10, with a thickness of between about 40 nm and about 120 nm.

At 556, the front metal contacts (aligned to the deposited sub-critical shear thinning nanoparticle fluid pattern) and rear metal contacts are deposited, forming the solar cell. Specifically, by measuring a ratio of reflectivity within a specific wavelength region between a first highly doped region (formed by the deposition of sub-critical shear thinning nanoparticle fluid) and a second lightly doped diffused region, a set of metal contacts, may be deposited in a manner optimized for each individual solar cell substrate. In one configuration, the front metal contacts are deposited using a screen printer. In another embodiment, a polymer based screen is used in order to avoid metal contamination. This method of metal alignment is further described in U.S. patent application Ser. No. 12/468,540 filed May 19, 2009, now U.S. Pat. No. 8,048,814, the entire disclosure of which is incorporated by reference.

Consequently, the resulting solar cell may have a typical sheet resistance in substrate surface areas where the sub-critical shear thinning nanoparticle fluid was not deposited is between about 90 Ohm/sq. to about 130 Ohm/sq, whereas substrate surface areas underneath the deposited sub-critical shear thinning nanoparticle fluid may be below 60 Ohm/sq.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

As will be understood by one skilled in the art, for any and all purposes, particularly in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. In addition, the terms "dopant or doped" and "counter-dopant or counter-doped" refer to a set of dopants of opposite types. That is, if the dopant is p-type, then the counter-dopant is n-type. Furthermore, unless otherwise dopant-types may be switched. In addition, the silicon substrate may be either mono-crystalline or multi-crystalline. In addition, "undoped" refers to a material with a lack of dopant. As described herein, the ketone molecules and the alcohol molecules may be cyclic, straight, or branched.

Furthermore, this invention may be applied to other solar cell structures as described in U.S. patent application Ser. No. 12/029,838 filed Feb. 12, 2008, published as U.S. patent application publication no. 2010/0275982A1, the entire disclosure of which is incorporated by reference.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

Advantages of the invention include a substantially uniformly deposited sub-critical shear thinning nanoparticle fluid that is optimized for screen printing.

Having disclosed exemplary embodiments and the best mode, modifications and variations may be made to the disclosed embodiments while remaining within the subject and spirit of the invention as defined by the following claims.

What is claimed is:

1. A silicon nanoparticle fluid comprising:
a set of silicon nanoparticles, wherein the set of silicon nanoparticles is present in an amount of between about 1 wt % and about 20 wt % of the silicon nanoparticle fluid and wherein an average size of the silicon nanoparticles is less than about 100 nm;
a binder; and
a set of capping agent molecules , wherein at least some capping agent molecules of the set of capping agent molecules are attached to the set of silicon nanoparticles, wherein the fluid is a shear thinning fluid and wherein the silicon nanoparticle fluid has a viscosity of about 5 KcP to about 20 KcP at a shear rate of about 10 $\sec^{-1}$.

2. The silicon nanoparticle fluid of claim 1, wherein the set of silicon nanoparticles is present in an amount of between about 2 wt % and about 15 wt % of the silicon nanoparticle fluid.

3. The silicon nanoparticle fluid of claim 1, wherein the set of silicon nanoparticles is present in an amount of between about 4 wt % and about 10 wt % of the silicon nanoparticle fluid.

4. The silicon nanoparticle fluid of claim 1, wherein the set of capping agent molecules comprises at least one of a set of alcohol molecules and a set of ketone molecules.

5. The silicon nanoparticle fluid of claim 4, wherein the set of alcohol molecules is present in an amount of up to 90 wt % of the silicon nanoparticle fluid.

6. The silicon nanoparticle fluid of claim 4, wherein the set of alcohol molecules is present in an amount of up to 80 wt % of the silicon nanoparticle fluid.

7. The silicon nanoparticle fluid of claim 4, wherein the set of alcohol molecules is present in an amount of up to 70 wt % of the silicon nanoparticle fluid.

8. The silicon nanoparticle fluid of claim 4, wherein the set of capping agent molecules comprises a set of alcohol molecules.

9. The silicon nanoparticle fluid of claim 4, wherein the set of capping agent molecules comprises a set of ketone molecules.

10. The silicon nanoparticle fluid of claim 1, wherein the set of nanoparticles is undoped.

11. The silicon nanoparticle fluid of claim 1, wherein the set of nanoparticles is doped with one of boron and phosphorous.

12. The silicon nanoparticle fluid of claim 1, wherein the binder is cellulose or ethylcellulose.

13. The silicon nanoparticle fluid of claim 1, wherein an average size of the silicon nanoparticles is from about 5 nm to about 35 nm.

14. The silicon nanoparticle fluid of claim 1, wherein a content of granular materials in the fluid is less than 10 wt %.

* * * * *